: 
United States Patent [19]

Hatchard et al.

[11] Patent Number: 6,046,507
[45] Date of Patent: Apr. 4, 2000

[54] ELECTROPHORETIC COATING METHODOLOGY TO IMPROVE INTERNAL PACKAGE DELAMINATION AND WIRE BOND RELIABILITY

[75] Inventors: Colin D. Hatchard, Campbell; Richard C. Blish, II, Saratoga, both of Calif.

[73] Assignee: Advanced Micro Devices, Sunnyvale, Calif.

[21] Appl. No.: 08/986,087

[22] Filed: Dec. 8, 1997

[51] Int. Cl.$^7$ .................................................. H01L 23/48
[52] U.S. Cl. .......................... 257/790; 257/787; 438/124; 438/126; 438/127
[58] Field of Search .................................... 257/790, 669, 257/678, 787; 438/127, 106, 124, 126

[56] References Cited

U.S. PATENT DOCUMENTS

| | | | |
|---|---|---|---|
| 4,486,945 | 12/1984 | Aigoo ........................................ | 257/790 |
| 5,208,467 | 5/1993 | Yamazaki .................................. | 257/790 |
| 5,276,351 | 1/1994 | Yamazaki et al. ....................... | 257/669 |
| 5,656,830 | 8/1997 | Zechman ................................. | 257/790 |

OTHER PUBLICATIONS

Robert Kessel, "Taking a Look at a New Topcoat Technology", Home Lighting & Accessories, Clifton, NJ, (printing date unknown).

Jonathan Holland and Robert Berger, Ph.D., "Electrophoretic Deposition: A New Answer to Old Questions", Plating and Surface Finishing, Aug. 1993.

PF Special New Product Report, "Water–Borne Topcoat for Heavy Builds", Product Finishing, Jun. 1994, pp. 136, 156, and 165.

Clearlyte® HB, Water–Based, Electrophoretic Topcoat For Heavy Build Applications, Enthone–OMI.

UDYLITE® Technical Data Sheet, © 1994, Enthone–OMI Inc., pp. 1–12 (minus p. 11, which is a page for taking notes).

Primary Examiner—Donald L. Monin, Jr.
Assistant Examiner—Michael Dietrich
Attorney, Agent, or Firm—LaRiviere, Grubman & Payne, LLP

[57] ABSTRACT

Method for implementing a multi-phase plastic package for electronic components, and packaged electronic components produced according to the method. The principles of the present invention contemplate electrostatically depositing an exceptionally uniform coating on electronic components, especially microchips, and more especially still, on integrated circuits prior to the encapsulation of the electronic components into plastic-packaged components. The coating, for instance applied to a completed leadframe assembly, including die and wire bonds, serves two purposes. It improves adhesion of the molding compound forming the package, thereby reducing the chances for delamination of the package. The coating also isolates the relatively fragile wire bonds, including their attachment points to the chip and the bonding pads and the leads, from chemical and metallurgical attack by the flame retardant found in many molding compounds.

1 Claim, 3 Drawing Sheets

SECTION I-I'

ELECTROPHORETIC COATING METHODOLOGY TO IMPROVE INTERNAL PACKAGE DELAMINATION AND WIRE BOND RELIABILITY

TECHNICAL FIELD

The present invention relates to the plastic packaging of electronic components. More particularly, the present invention relates to plastic resin encapsulation of integrated circuits; to a methodology for reducing the delamination of the resin encapsulant from the electronic components by applying a defect-free coating to the wire-bonded chip prior to encapsulation, and to the encapsulated electronic components, including plastic-resin encapsulated integrated circuits, produced according to the method.

BACKGROUND ART

After wafer fabrication, semiconductor chips undergo several processes to prepare the chips for eventual use. By way of illustration, but not limitation, some of these processes include: backside preparation; die separation; die pick; inspection; die attach; wire bonding; pre-seal inspection; package sealing; plating; trimming; marking; and final testing. Many of these processes can be categorized as part of the packaging, or enclosure process.

One form of enclosure common to semiconductor or integrated circuit (IC) manufacture is the molded epoxy package. Epoxy packages perform the four basic requirements of an electronic package for the circuit chip, or die ("chip") they house: they support a substantial lead system for connecting the device to the system component which will utilize it; they provide physical protection of the device from breakage, contamination and abuse; they protect the device from environmental hazards such as chemicals, moisture and gasses which could interfere with device performance; and they provide a path for dissipating the heat generated by the functioning of the device. Epoxy packaging presents several major advantages over some other device packaging technologies: it is light in weight, low in cost, and high in manufacturing efficiency.

One method of epoxy packaging of semiconductor devices is illustrated in prior art FIGS. 1 and 2. Having reference to those figures, this methodology is explained as follows: after die separation (and in some cases, after some of the previously mentioned steps, the die, 1', concentric with device 1, is attached and bonded to a composite lead frame, 2. In the exemplar here presented, lead frame 2 includes horizontal rails, 5, and vertical tie bars, 7, and provides a plurality of lead systems for connecting to the semiconductor dice (not shown), thereby producing the useful individual device. In this example there are provided a plurality of individual device lead frames 2, each having mounted thereon a further plurality of dice, 1'. After die mounting, the lead frames having the dice mounted thereon are often given some form of pre-seal inspection.

After the pre-seal inspection, the lead frames are transferred to a molding apparatus. Commonly used in this procedure is a transfer molding process which encapsulates and surrounds each of the dice and at least a portion of the lead frame assembly with a plastic encapsulant, or molding compound. Commonly utilized molding compounds include, but are not limited to: epoxies, monomers, polymers, and other resins. In the exemplar here presented, a silica-filled epoxy is utilized as the molding compound, or encapsulant.

The lead frames are placed in a mold, here a two-part mold consisting of mold halves 20 and 21. At least one mold half, often the bottom, has formed therein a gate, 10. The mold halves are clamped together, typically with some force, and often a portion of the lead frames, 2, completes the mold cavity, 16. The vent, 24, which provides a path for escaping air during the transfer molding process, is typically filled with the encapsulant during that operation.

After the mold has been clamped about lead frames 2 and dice 1', the ram assembly of the molding apparatus is charged with a quantity of molding compound, for instance as a homogenous pellet, through sprues 14. The prior art homogenous molding compound pellet may include a quantity of silica-filled epoxy may incorporate some or all of the adjuncts desired for the package. The epoxy material may have been previously softened by means of heating or chemical reaction. The transfer molding apparatus then induces pressure, usually by means of a ram in operative combination with sprue 14, on the molten, viscous epoxy and it flows from sprues 14 through a series of runners, 12, through tapered sections 11 of gates 10, and thence into mold cavities 16. As the ram (not shown) continues to apply pressure to the mass of liquid epoxy, it is then forced around the integrated circuit dice, 1', encapsulating the dice and forming the individual packages, or devices, 1.

After the epoxy is at least partially polymerized (set), the molds are separated, and the lead frame assembly is removed therefrom. This assembly may then be further cured by an oven or other heat means. Following final curing, the packages undergo further processing including, but not limited to: plating; runner removal; de-flashing; marking; and final testing. The finished packaged component is then ready for use.

Referring now to FIG. 3, a prior art plastic resin encapsulated integrated circuit device, 1, formed in accordance with the previously discussed process is shown. Device 1 comprises an integrated circuit (IC) device, 1', for instance a silicon IC chip. Chip 1' is bonded to a copper die paddle 30, in this exemplar by means of a layer of silver-loaded epoxy or polyimide adhesive, 32. Device 1 further comprises at least one, and more generally a plurality of leads 34. Leads 34 are electrically connected in this example by means of wire bonds 36. Wire bonds 36 are typically first bonded to the correct chip bonding pad and then spanned to an inner end of lead 34. Lead 34 is commonly, but not exclusively, manufactured from copper alloy, and may include a layer of plating, for instance silver plating 38, to increase the reliability of the wire bonding process. Leads 34 and die paddle 30 are typically formed utilizing the lead frame technology previously discussed. The previously discussed components are encapsulated, in this prior art example, by means of a mass of silica-charged epoxy, 40, in the manner hereafter discussed.

Prior art molding compounds typically consist of a homogeneous mixture of silica, epoxy (whether plain or brominated), and one or more molding compound adjuncts including, but not necessarily limited to: flame retardants, including antimony trioxide and brominated epoxy; cross-linking agents; inhibitors; ionic wetters; and mold release agents.

Transfer molding compounds, including the previously discussed epoxy molding compounds commonly used for the encapsulation of silicon IC devices, have variable adhesion to the several elements encapsulated within the package. In particular, adhesion of prior art molding compounds to the silver plated lead frames, as well as to the gold bonding wires, is poor. This is partially due to the fact that both gold and silver are substantially noble metals, which is to say that neither is particularly chemically reactive and neither forms a tenacious oxide. The biggest part of the problem, however, is due to the composition of the molding compound itself, and most particularly to the homogenous inclusion of molding compound adjuncts, including mold release agents therein.

Release agents typically include waxes (commonly carnauba or its synthetic equivalent) and stearates (commonly as the calcium or zinc salts of stearic acid). These release agents are incorporated into molding compounds to permit the encapsulated IC to be removed easily from its mold. The mold release compounds are typically incorporated into the molding compound, as the topical application of the mold release compound to the mold itself for each "shot" would be time-consuming, messy, and potentially incomplete. Naturally, these waxes and stearates, whose typical melting points are on the order of 80° to 180° C., prevent sticking of the molding compound to the internal surface of the mold. Their presence in the molding compound, however, has a negative internal effect: they impede the adhesion of the molding compound to the lead frame and to the silicon chip as well.

A commonly used fire retardant system in encapsulated semiconductor manufacture is the inclusion in the molding compound of antimony trioxide and brominated epoxy. The use of flame retardants is mandated by the fact that some encapsulated electronic devices have in past generated sufficient heat whereby the flash point of the molding compound has been reached and a fire ensued. In the event that the encapsulant containing this fire retardant system reaches its flash temperature, antimony trioxide and brominated epoxy combine to form antimony tribromide, a dense, heavy, flame retardant gas, which gas precludes the flames' spread. Unfortunately, both of these flame retardant materials, as well as other known flame retardant materials, when brought into contact with an encapsulated semiconductor device's wire bonds to degrade the wire bonds' reliability. This degradation typically comes as a result of the chemicals causing a failure of the inter-metallic bond between the bonding wire and at least one of the lead and/or the bonding pad on the chip.

The preceding discussion presents a broad overview of the plastic packaging of electrical components, as practiced by others having ordinary skill in the art. Details of one example of such a molding process can be found in U.S. Pat. No. 4,697,784 to Schmid.

Homogenous molding resins were never intended to provide a hermetic seal around the plastic encapsulated IC chip, but they are expected to preserve the initial or time zero (pre-stress) properties and functionality thereof. Indeed, most authorities on IC packaging refer to the use of epoxy resins or copolymers, including silicones, as "non-hermetic". This gives rise to a first class of problems associated with current molding compound technology, relating to the unwanted adsorption, by the packaged device, of water. A second class of problems, which may or may not be exacerbated by non-hermetic sealing of the device results from the chemical and metallurgical interactions between at least some of the integrated circuit components and the homogenous encapsulant.

The fact that the previously discussed plastic resin encapsulation methods and materials do not provide a hermetic seal for the enclosed electronic component has given rise to a number of technical imperfections. One such imperfection is the internal delamination which can occur within a plastic-encapsulated electronic device, especially an integrated circuit, after the device adsorbs an unwanted degree of humidity or moisture. When such a device contained adsorbed or entrained water is exposed to rapid heating during assembly or component use, particularly use in surface mount packaging technology, the heat generated when the device is powered can cause the moisture entrapped within the package to flash to steam, resulting in a rapid internal package delamination. This delamination can disrupt normal IC function or connection with the printed circuit board. Internal delamination can also disturb the stress and strain distribution in the package, perhaps thereby leading to package fracture, disruption of proper heat dissipation and impaired performance in high humidity environments.

Internal delamination may be undetectable from external inspection, and may only be detected when the device fails. In its more severe form, the package may expand and even rupture due to hydraulic expansion. This second technical imperfection, sometimes referred to as the "popcorn" phenomenon, is most commonly found in surface mount technology devices.

The problems associated with entrained moisture within encapsulated IC devices are well known, and their regulation and/or elimination is the subject of a number of technical standards promulgated by the Joint Electron Device Engineering Council (JEDEC) of the International Electronics Association (IEA). JEDEC Standards JESD22A103 and JESD22A104 set forth a number of standard levels which define levels of entrained moisture or humidity.

Because of their inherently superior reliability, IC devices meeting the low entrained moisture requirements of a JESD22A104 Level 1 device are not only more reliable than devices meeting lower, less stringent standards: they are more commercially valuable than devices which can only meet a lower standard. Accordingly, IC manufacturers currently go to extreme lengths to provide Level 1 devices wherever possible.

Measures undertaken by manufacturers to provide their customers manufacturable SMT components include the practice commonly known as "bake and bag". This practice consists of heating the finished components to a given temperature for a given period of time in order to dry them out (thereby ensuring at least temporary protection from delamination/popcorn), and then immediately sealed in hermeticallysealed containers (e.g.: impermeable bags) with a desiccant. In this manner the package, at least as shipped from the manufacturer, meets the customer's manufacturability expectations.

JEDEC Level 1 parts are greatly preferred by IC assemblers as the moisture performance rating ("popcorn invulnerable") implies an unlimited lifetime on the surface mount technology floor device, so the assembler need not watch the clock nor re-bake the IC devices if too much time has elapsed from the opening of the bag until the assembly of the device into the apparatus into which it is incorporated.

The work of others to overcome the vulnerability of plastic-encapsulated electronic devices to retaining sufficient entrained moisture to preclude level 1 certification has centered on the search for a "magic combination" of an ideal reduced hygroscopius homogenous molding compound coupled with a specific process technology using the compound in an ideal manner, which combination results in the production of packaged device having reduced vulnerability to attack by humidity. The reality, unfortunately, is that all such combinations to date have fallen short of desired performance levels. This is particularly true for more massive IC packages, and so the "fall back" position currently utilized by many manufacturers is to characterize the JEDEC performance level as comprehensively as possible and inform the user of the level, so that the user can manage his or her processes, such that popcorn failures are reduced.

In summary, the current situation is largely a proposition of "build it and then characterize how good or bad the chip is". There is currently no means available reliably ensure that substantially all the integrated circuits encapsulated during manufacture meet JEDEC Level 1 standards, thereby preventing internal package delamination, and susceptibility of the device to popcorn failure.

The second broad class of problems with current homogenous molding compound technology are those caused by the flame retardants in the molding compounds. A commonly used flame retardant system in encapsulated semiconductor manufacture is the inclusion in the molding compound of antimony trioxide and brominated epoxy. The use of flame retardants is mandated by the fact that some encapsulated electronic devices have in past generated sufficient heat whereby the flash point of the molding compound has been reached and a fire ensued. In the event that the encapsulant containing this flame retardant system reaches its flash temperature, antimony trioxide and brominated epoxy combine to form antimony tribromide, a dense, heavy, flame retardant gas, which gas precludes the flames' spread.

The use of the previously discussed flame retardant materials, as well as other known flame retardant materials, gives rise to the second discussed problem with current molded package technologies. Some of these flame retardant chemicals, especially brominated epoxy, when brought into contact with an encapsulated semiconductor device's wire bonds tends to degrade the wire bonds' reliability. This degradation typically comes as a result of the flame retardant or retardants causing a degradation or even failure of the inter-metallic bond between the bonding wire and at least one of the lead and/or the chip bonding pad.

What is clearly needed therefore, is a methodology which encapsulates electronic devices reliably, thereby ensuring such intimate bonding of the molding compound with the encapsulated IC chip, lead frame components, and bonding wires that JEDEC Level 1 performance can routinely be achieved and maintained. What is further needed is a methodology which precludes the vulnerability of integrated circuit wire bond degradation due to chemical or metallurgical attack.

The preceding background discussion of the manufacture of integrated circuits is, in part, summarized from *Microchip Fabrication*, Peter van Zant, McGraw-Hill, 1997. This background information is herewith incorporated by reference.

DISCLOSURE OF INVENTION

The present invention teaches the use of an exceptionally uniform, preferably thin, electrostatically applied coating, for instance an acrylic electrocoat, applied to the completed leadframe/chip/wire bond assembly (hereafter "leadframe assembly" ) prior to encapsulation. Encapsulation is subsequently complete with silica-charged epoxy molding compound.

After the leadframe assembly of a semiconductor device is completed by attaching the die thereto, and by electrically spanning the wire bonds from the die to the leadframe, the leadframe is cleaned and, where necessary, conditioned prior to coating. When any required pre-coating steps are completed, the cleaned leadframe assembly, including the leadframe's continuous "dam bars", is connected to an electrical power source it a first polarity. The dam bars preclude electrical potential damage jeopardy to the completed leadframe assembly, including electrostatic discharge (ESD) and electrostatic overstress (EOS).

A conductor is similarly connected to the electrical power source, at the second, or opposite polarity. A coating material, for instance an unpolymerized monomer, is brought into electrical contact with the second conductor, thereby charging the coating material at the second polarity. The charged coating material is then brought into contact with the leadframe assembly and, being electrostatically attracted thereto, is deposited onto all of the conductive surfaces of the leadframe assembly. Electrostatic and completeness, because any thin spot will exhibit a larger electric field from elsewhere, thereby attracting additional charged material.

The electrostatic deposition step may be performed by means of vapor deposition, electrostatic spray, or electrophoretic deposition of coating materials (E-coat). The coating so provided is exceptionally uniform and free of pinholes.

Following deposition of the coating material, substantially that portion of the coated leadframe assembly which will receive leadfinish (e.g. plating applied to the package leads) is masked, and the unmasked portion is subjected to a curing process. Masking may be accomplished through the use of photomasks or other masking means well known to those having ordinary skill in the art. The coating may be cured by application of: heat; radiation, including ultraviolet radiation; the application of catalysts or other curing, additives; again including other polymer curing methodologies known to those having ordinary skill in the art. As an alternative, the masking step may be performed prior to coating deposition, the mask (bearing the coating away from the unmasked portion of the leadframe assembly) being removed thereafter, either before or after the curing step.

If the curing step is selectively performed, for instance by light or UV, the uncured portion of the coating is removed, typically by means of solvents, washing or the like, although the principles of the present invention contemplate the use of abrasives (often organic media such as walnut hulls, apricot hulls, sometimes alumina), as well as acids, bases, or other chemicals.

Following the removal of the uncured portion of the coating, the coated leadframe assemblies are packaged. This packaging step is typically conducting as the transfer molding of a silica-charged epoxy molding compound about the leadframe assemblies as shown in prior art FIG. 1. Alternative packaging methodologies may be implemented with equal facility where desirable.

The elcetrodeposited coating provides for both superior adhesion to the molding compound as well as insulation of the wire bonds from the flame retardant adjuncts to the molding compound.

A discussion of Electrophoretic coating technology can be found in *Electrophoretic Deposition: A New Answer to Old Questions*. Jonothan Holland and Robert Berger, PhD. Published in Plating and Surface Finishing, August 1993, which is herewith incorporated by reference.

Other features of the present invention are disclosed or apparent in the section entitled "DETAILED DESCRIPTION OF THE INVENTION".

BRIEF DESCRIPTION OF DRAWINGS

For understanding of the present invention, reference is made to the accompanying drawing in the following DETAILED DESCRIPTION OF THE INVENTION.

In the drawing.

Prior art

Prior art

Prior art

Prior art

DETAILED DESCRIPTION OF THE INVENTION

Figure 1:
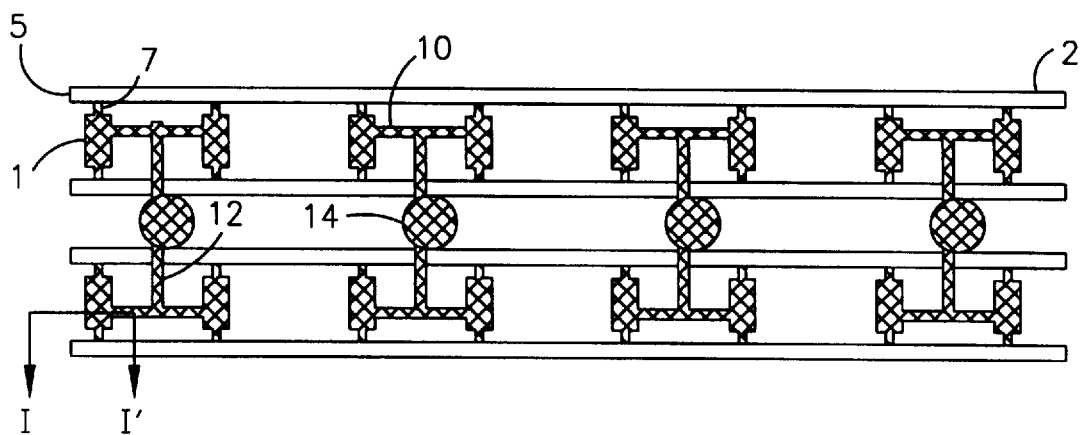
FIG. 1 is a plan view of a previous lead frame having molded thereon a plurality of sprue/runner/gate/device structures, the lead frame being removed from the mold which formed it.
Figure 2:
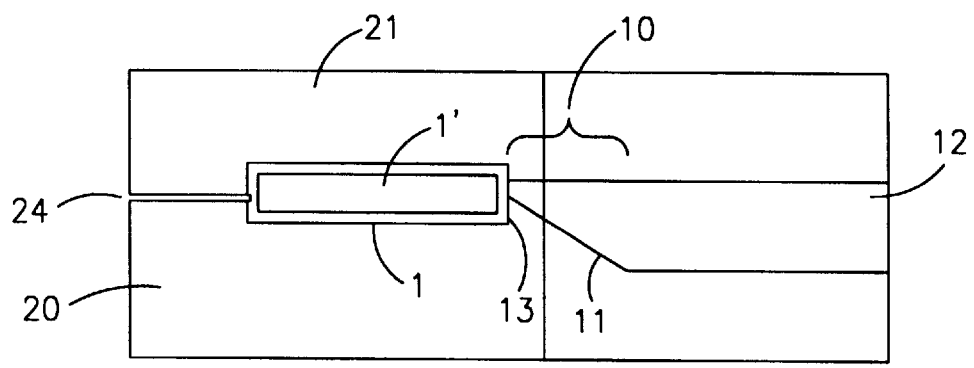
FIG. 2 is a transverse section through a portion of the mold which formed the previous sprue/runner/gate/device structure.
Figure 3:
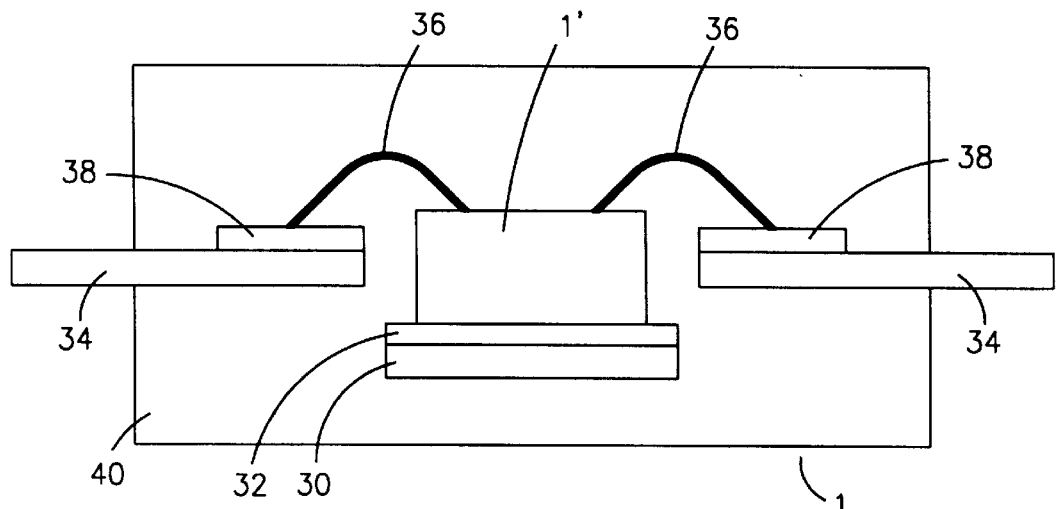
FIG. 3 is a transverse section of a plastic-encapsulated integrated circuit employing a homogeneous molding compound.
Figure 4:
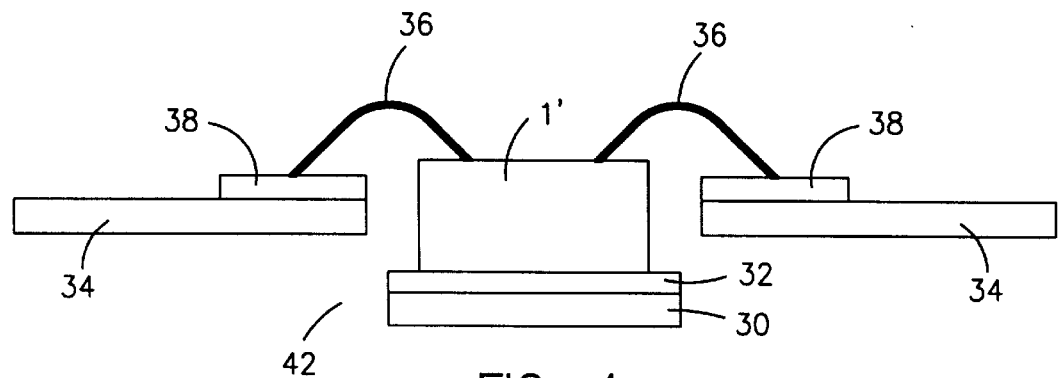
FIG. 4 is a transverse section through a completed leadframe assembly.

Referring now to FIG. 4, a transverse section through a prior art completed leadframe assembly, 42, is shown comprising an integrated circuit (IC) device, 1', for instance a silicon IC chip. Chip 1' is bonded to a copper alloy die paddle 30, in this exemplar by means of a layer of silver-charged epoxy or polyimide adhesive, 32. Device 1 further comprises at least one, and more generally a plurality of leads 34. Leads 34 are electrically connected in this example by means of wire bonds 36. Wire bonds 36 are typically first bonded to the correct chip bonding pad and then spanned to an inner end of lead 34. Lead 34 is commonly, but not exclusively, manufactured from copper alloy, and may include a layer of plating, for instance silver plating 38, to increase the reliability of the wire bonding process.

A first preferred embodiment of the present invention contemplates coating the completed leadframe assembly using an E-coat process. The E-coat process utilizes the fact that under an applied electrical potential, acid is generated at the anode, and base at the cathode. Given a sufficiently high applied voltage, ionic compounds are forced to migrate to the desired electrode, where acid-base neutralization causes the precipitation of an organic resin. Once a small amount of coating has been deposited in a high-current-density region, that region becomes insulating and additional coating deposition is forced onto low-current-density regions. The process results in an extremely uniform coating.

Of the two forms of E-coats, anodic and cathodic, the cathodic method is employed for the first preferred embodiment. The cathodic method, while undertaken in a slightly acidic bath, results in the generation, at the cathode (i.e., the leadframe assembly) of a base, as opposed to the acid generated by the anodic method. The base so formed precipitates the acidic quasi-stabilized resin along with its cross-linkers and flow agents. Even though the bath is mildly acidic, the cathode is relatively highly basic when electrical potential is applied to the system. This precludes excessive degradation to the chip itself during coating.

The cathodic E-coat is applied as follows:

The completed leadframe is cleaned to ensure proper bonding with the coating, rinsed with water (preferably water de-ionized to a conductivity less than 5 micro-Siemens (iS)). and pre-dipped for about 30 seconds in a mildly acidic pre-dip solution (without coating solids) with agitation. In a first preferred embodiment of the present invention, a 1% (by volume) dilution of CLEARLYTE® HB in water de-ionized to a conductivity less than 5 micro-Siemens (iS) is used as both the pre-dip and later discussed post-dip solutions. CLEARLYTE® HB is available from Enthone-OMI, 21441 Hoover Road, Warren Mich. 48089.

The leadframe is then submerged in an E-coat coating solution, and conducted to the negative pole of a direct current power supply. CLEARLYTE® HB is again used in this preferred embodiment, this time diluted to provide a desired solids content (i.e., excluding volatiles). In a first preferred embodiment, about 4–25% coating solids (acrylic urethane lacquer solids), more about preferably 7–18% solids, and more preferably still around 14–16% coating solids. The coating solution further contains solvents as well as various cross-linking and flow agents. Processing temperatures are from 10–40° C., preferably from 20–35° C., and more preferably still from about 20 to about 35° C. In a first preferred embodiment of the present invention, the coating solution pH should be in the range of from 4.4 to 4.8 is desirable. The coating solution may be gently agitated during processing to ensure uniform application. Additionally, the coating solution level should be maintained during processing and should be filtered during use; the solids and solvents contents maintained at the prescribed levels; and the pH maintained. CLEARLYTE® SOLVENT Nos. 6, R, and T may be used to compensate for solvent losses by filtration, evaporation, and dragout. The exact quantity, type and mixture of solvents is highly application specific. CLEARLYTE® solvents are also available from Enthone-OMI.

A stainless steel anode is inserted into the coating solution at an anode-to-cathode ratio of around 1:4, and connected to the positive pole of the direct current power supply.

A direct current voltage of around 10 to 100 VDC, preferably from about 20 to 70 VDC, and more preferably still from about 40–45 VDC, is applied to the leadframe assembly. Current density should average around 0.5 to 1.0 A/ft$^2 \approx$1 mA/cm$^2$) with an initial surge not in excess of around 3.0 A/ft$^2$. The leadframe, attached to the negative side of the power source, forms the cathode in this electrodeposition embodiment. A soak delay of up to a minute, where the leadframe is submerged in the coating bath prior to application of voltage, may be occasioned by the use of some E-coat materials. Processing time is again highly application specific, but should be less than around three minutes. In the previously described embodiment, coating depositions of around 24 to 28 microns (im) were achieved after about three minutes.

Figure 5:
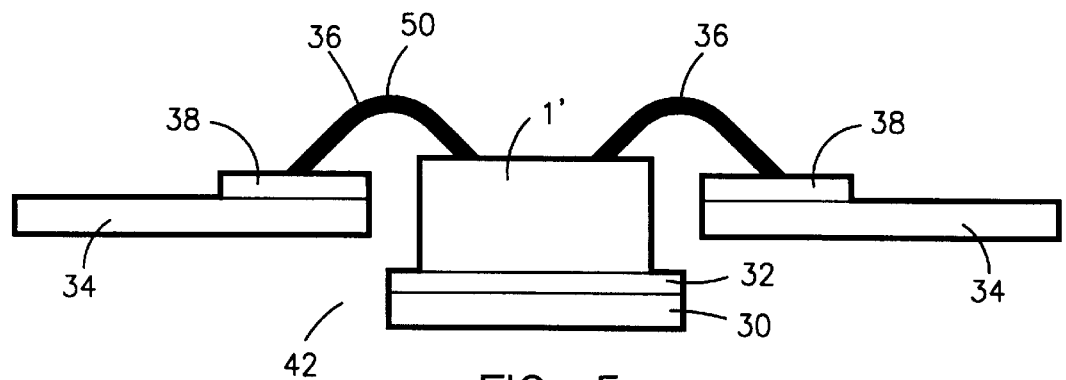
FIG. 5 is a transverse section through a leadframe assembly having applied thereto an uncured coating layer.

Following coating deposition the leadframe assembly, now bearing an uncured coating is removed from the coating bath and subjected to a post-dip E-coat bath solution for around 20 seconds, then rinsed in de-ionized water and excess moisture removed, for instance by shaking. Having reference to FIG. 5, substantially all of the leadframe assembly 42, including die 1', die paddle 30, plated surfaces 32 and 38, wire bonds 36 and leads 34 is now coated with a uniform layer of uncured coating, 50.

Figure 6:
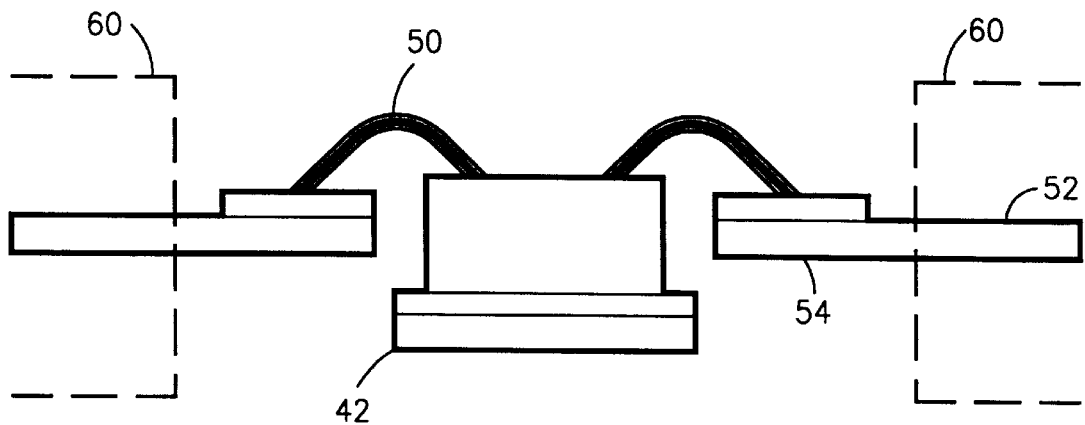
FIG. 6 is a transverse section through a leadframe assembly having applied thereto an uncured coating layer, and a photomask masking a portion of the electrical

Having reference now to FIG. 6, after post-dip and rinse, coated leadframe 42 is masked as shown at 60. Mask 60 is preferably implemented as a photomask: alternatively other masking technology known in the art may, with equal facility, be implemented. The purpose of mask 60 is to enable the curing of the unmasked portion 52 of coating 50. The masked portion, 54, of coating 50 is left uncured.

Curing is effected by means of applying heat or other radiation to the unmasked portion 52 of coating 50. In a first preferred embodiment of the present invention the unmasked portion 52 of the coating is cured by the application of ultraviolet radiation. The use of ultraviolet radiation polymerizes the previously uncured coating. The use of ultraviolet radiation to effect polymerization may require modification of the CLEARLYTE® HB system. Alternatively, infrared radiation may be used to bring the coated leadframe assembly to a temperature of around 160° C. for about 20 minutes. In a further alternative to this embodiment, curing may be achieved by heating the coated leadframe assembly to around 160° C. for about 20 minutes in a circulating air flow oven. In either alternative the exact radiation frequencies, temperatures, and cure times are will depend on several chip-specific factors including, but not limited to area, thickness, wire bond density, and leadframe topology.

Figure 7:
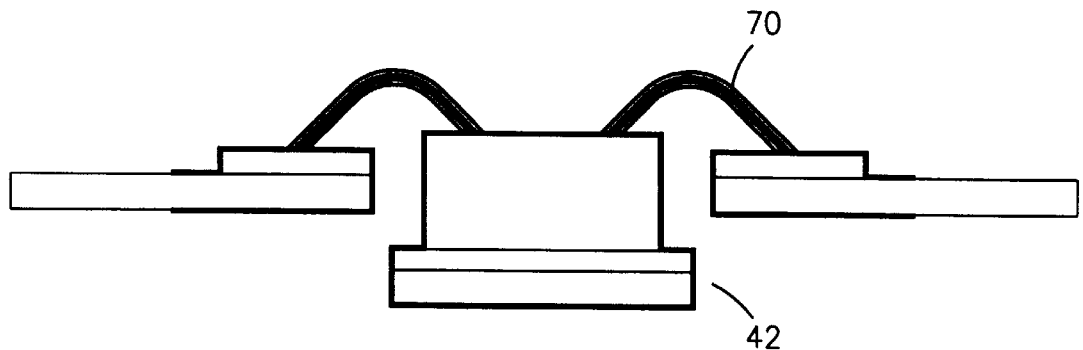
FIG. 7 is a transverse section through a leadframe assembly after the coating has been removed from the masked portion of the electrical leads of the leadframe assembly.

After curing, the masked (uncured) portion 54 of coating 50 is removed by solvent, for instance methyl ethyl ketone, by abrasion, or the like. The resulting leadframe assembly, 42, partially coated with a cured coating layer 70, is shown in FIG. 7.

Figure 8:
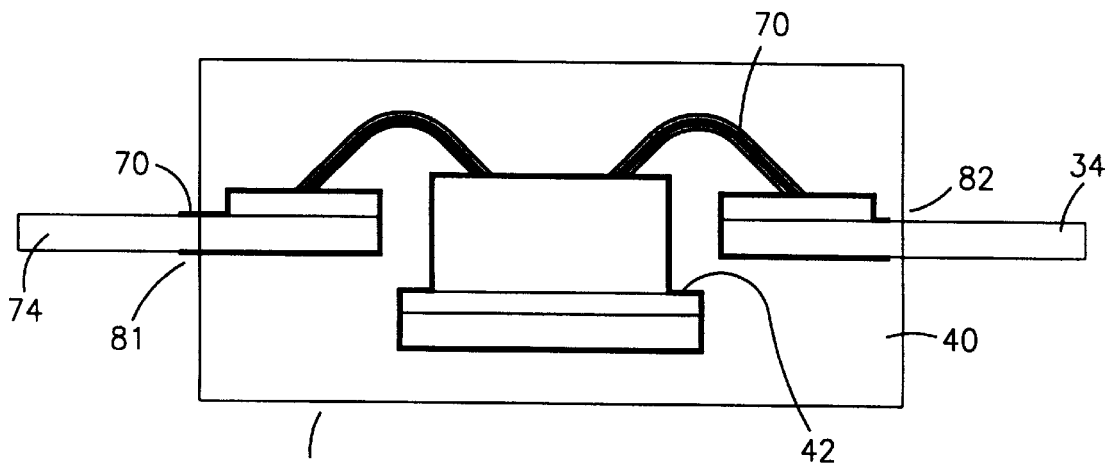
FIG. 8 is a transverse section through a completed plastic-packaged electronic device formed in accordance with the principles of the present invention.

Following the removal of the unmasked, extraneous portion of coating (not shown), the partially coated leadframe assembly is placed in a transfer molding apparatus (not shown) and packaged. Referring now to FIG. 8, the finished device, 801, is shown. To complete the device as shown, molding compound 40 has been injected by the transfer molding apparatus about the partially coated leadframe assembly 42 The adhesion of molding compound 40 to coating 70 is superior to its adhesion to at least some of the uncoated structures comprising the leadframe assembly for the reasons previously discussed. Moreover, coating 70 provides an effective barrier to chemical reaction between the components of leadframe assembly 42 and any adjuncts to molding compound 40, including the flame retardants thereof.

A further alternative to the present invention contemplates forming the package about the coated ship/leadframe/wire bond assembly using the non-heterogeneous molding compound technology taught in the patent application entitled "METHOD TO IMPROVE INTERNAL PACKAGE DELAMINATION AND WIRE BOND RELIABILITY USING NON-HOMOGENEOUS MOLDING COMPOUND PELLETS" filed on the same date herewith and identified by docket no. C589497.

Following injection of molding compound 10 about the coated leadframe assembly, the molding compound encapsulated devices are cured in the normal manner and the individual completed devices removed therefrom. Subsequent operations may include DTF (de-junk, trim and form), testing, labeling, and so forth in the manner well known to those having ordinary skill in the art.

A further alternative of the present invention contemplates curing the coating contemporaneously with the curing of the molding compound.

Having continued reference to FIG. 8, two treatments for the juncture of lead 34, coating 70, and molding compound 40 are contemplated. At 81, coating 70 is even with, or protrudes slightly from, molding compound 40. At 82, coating 70 is removed from lead 34, interior to molding compound 40. While it is believed that substantially either application will provide heretofore unattainable advantages in resistance to delamination is well as protection of the wire bonds, the treatment shown at 81 may be preferable in high-moisture environments.

The coating as shown at 81 and 82 ensures that no unfinished leadframe material remains following lead finish and dam bar removal. Moreover, the coating as applied at 81 is conformable, and acts to reduce flash resulting from the transfer molding process, and may further serve to eliminate the chemical de-flash step often required by the transfer molding process.

Alternative coating materials may, with equal facility be implemented in place of CLEARLYTE® HB. Desirable properties include a low modulus coating which improves temperature cycle performance (thermo-mechanical stress) by de-coupling the low CTE (Coefficient of Thermal Expansion) silicon chip from the high CTE molding compound.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the use of alternate molding compounds, adjuncts thereto, the order in which those compounds are introduced into the molding apparatus, and the application of the technology disclosed herein to alternate electronic components are all contemplated by the principles of the present invention. The invention disclosed herein may be practiced without any element which is not specifically disclosed herein.

We claim:

1. A method for packaging an electronic, the device including at least one electrical lead, the method comprising the steps of:

electrostatically applying a coating material to the electronic device and at least a portion of the lead, wherein the step of electrostatically applying a coating material comprises the steps of:
　　electrically connecting the at least one electrical lead to a first polarity: and
　　charging the coating material to a second polarity;
　masking part of the at least one electrical lead after electrostatically applying the coating material and before curing the coating material;
　curing the coating material, wherein the step of curing the coating material does not cure the masked part of the at least one electrical lead, so that part of the electrostatically applied coating covering part of the at least one electrical lead is uncured;
　removing the uncured part of the electrostatically applied coating; and
　forming a plastic package about, and in intimate contact with, at least a portion of the coating material.

* * * * *

UNITED STATES PATENT AND TRADEMARK OFFICE
CERTIFICATE OF CORRECTION

PATENT NO : 6,046,507
DATED     : APRIL 4, 2000
INVENTOR(S): COLIN C. HATCHARD & RICHARD C. BLISH, II

It is certified that error appears in the above-identified patent and that said Letters Patent is hereby corrected as shown below:

Column 6, Line 14 after the word "Electrostatic" add --deposition enables this to be accomplished to an exceptionally high degree of uniformity--.

Column 7, Line 19 after the word "electrical" add --leads of the leadframe assembly.--

Signed and Sealed this

Sixth Day of February, 2001

Attest:

Q. TODD DICKINSON

Attesting Officer

Director of Patents and Trademarks